United States Patent [19]
Tsunashima

[11] Patent Number: 5,324,686
[45] Date of Patent: Jun. 28, 1994

[54] METHOD OF MANUFACTURING SEMICONDUCTOR DEVICE USING HYDROGEN AS A DIFFUSION CONTROLLING SUBSTANCE

[75] Inventor: Yoshitaka Tsunashima, Tokyo, Japan

[73] Assignee: Kabushiki Kaisha Toshiba, Kawasaki, Japan

[21] Appl. No.: 959,457

[22] Filed: Oct. 9, 1992

Related U.S. Application Data

[63] Continuation of Ser. No. 636,435, Dec. 31, 1990, abandoned.

[30] Foreign Application Priority Data

Feb. 26, 1990 [JP] Japan ................. 2-42592

[51] Int. Cl.⁵ .................................. H01L 21/225
[52] U.S. Cl. ..................... 437/152; 437/154; 437/164; 437/937
[58] Field of Search ........... 437/161, 164, 152, 154, 437/151; 148/DIG. 30, DIG. 40, DIG. 157

[56] References Cited

U.S. PATENT DOCUMENTS

| | | | |
|---|---|---|---|
| 4,490,192 | 12/1984 | Gupta et al. | 437/164 |
| 4,571,366 | 2/1986 | Thomas et al. | 437/164 |
| 4,597,824 | 7/1986 | Shinada et al. | 156/643 |
| 5,173,440 | 10/1992 | Tsunashima et al. | 437/164 |

FOREIGN PATENT DOCUMENTS

| | | |
|---|---|---|
| 0041786 | 12/1981 | European Pat. Off. |
| 3235588 | 3/1984 | Fed. Rep. of Germany ...... 437/164 |
| 52-154341 | 12/1977 | Japan . |
| 0078134 | 5/1982 | Japan .................. 437/164 |

OTHER PUBLICATIONS

Wolf et al., Silicon Processing for the VLSI Era, (1986) pp. 280–283.
Japanese Journal of Applied Physics, vol. 9, No. 6, pp. 691-704 "Structural Changes of Arsenic Silicate Glasses with Heat Treatments"; Arai et al.; Jun. 1970.
Journal of Applied Physics, vol. 56, No. 10, pp. 2708-2715, "Diffusion Ion Implanted as in SiOz"; A. H. Van Ommen; Nov. 1984.

*Primary Examiner*—Olik Chaudhuri
*Assistant Examiner*—Ken Horton
*Attorney, Agent, or Firm*—Oblon, Spivak, McClelland, Maier & Neustadt

[57] ABSTRACT

A method of manufacturing a semiconductor device, which comprises the steps of forming a solid phase diffusion source containing a conductive impurity on a surface of a semiconductor substrate, said impurity serving to enable said semiconductor substrate to exhibit a p-type or n-type conductivity, allowing said solid phase diffusion source to contain a diffusion control substance serving to reduce or oxidize said conductive impurity upon heating so as to change the diffusion coefficient of the conductive impurity contained in the solid phase diffusion source, and thermally diffusing the conductive impurity from the solid phase diffusion source into the semiconductor substrate.

10 Claims, 7 Drawing Sheets

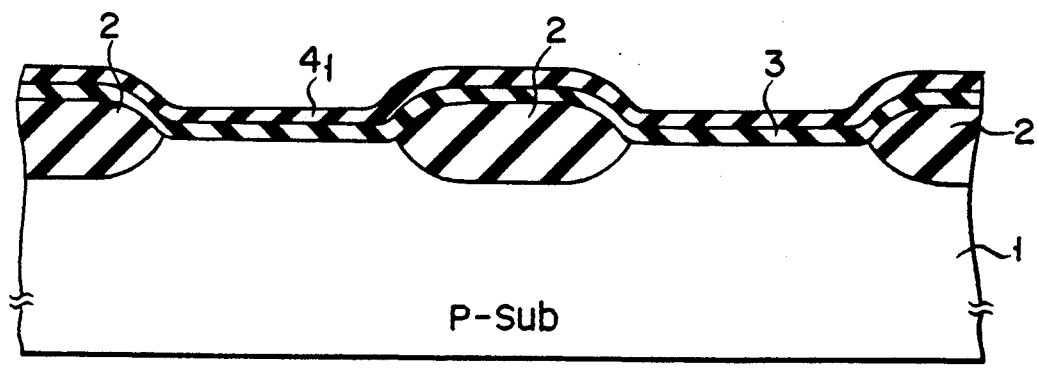
F I G. 1A
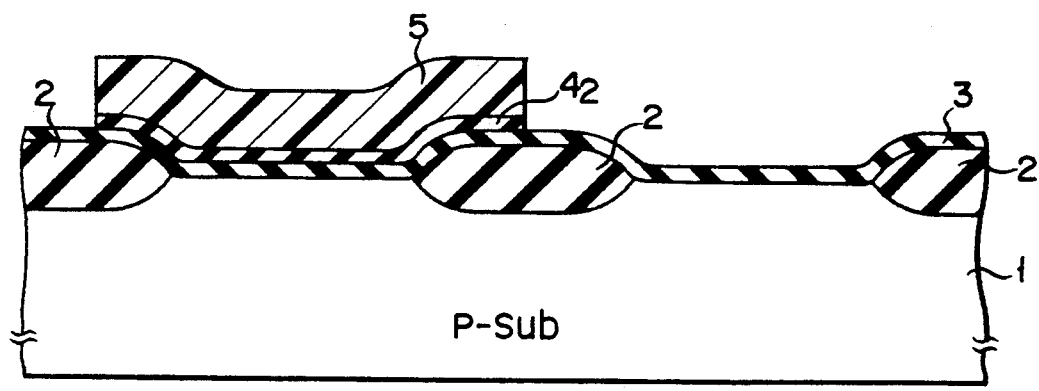
F I G. 1B
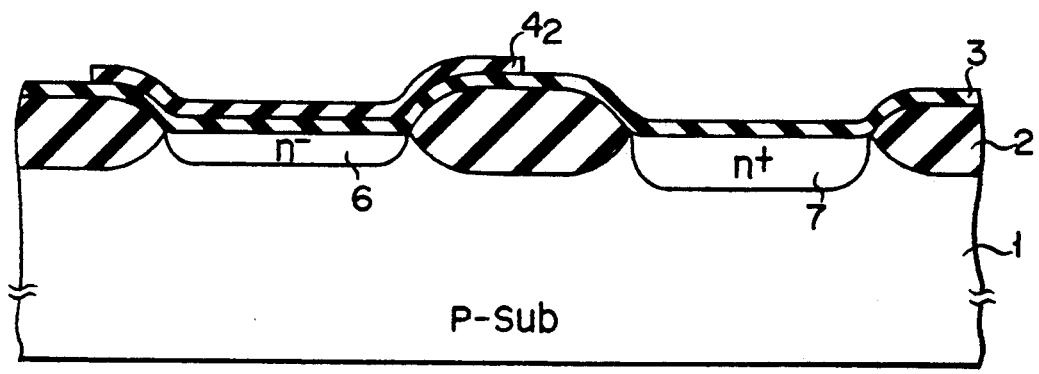
F I G. 1C

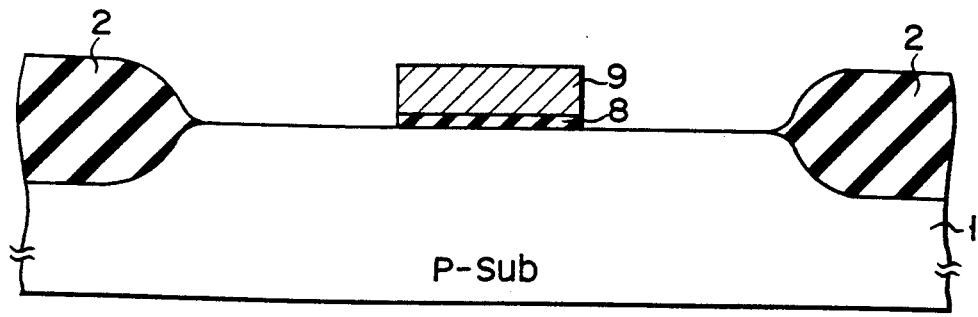
F I G. 3A
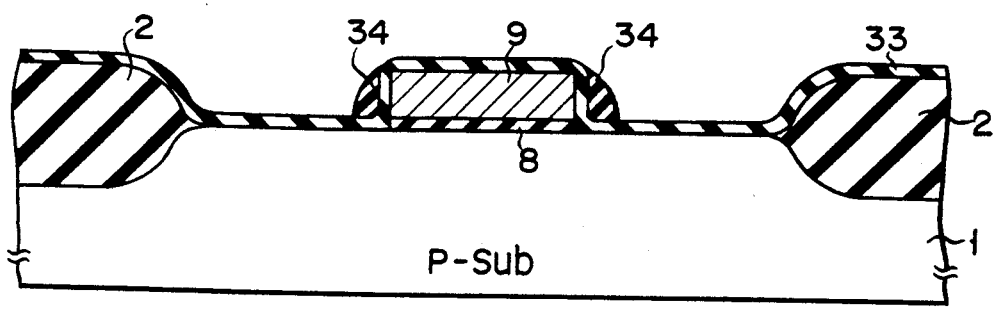
F I G. 3B
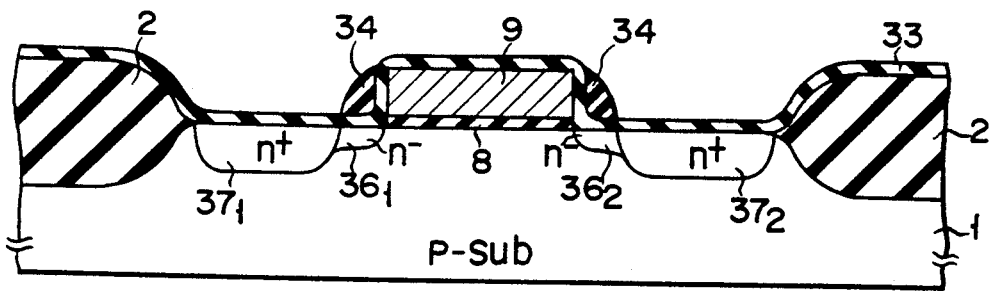
F I G. 3C
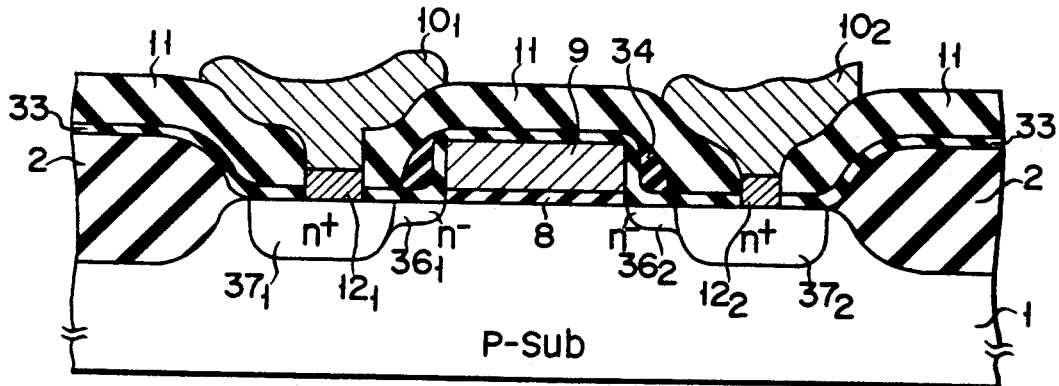
F I G. 3D

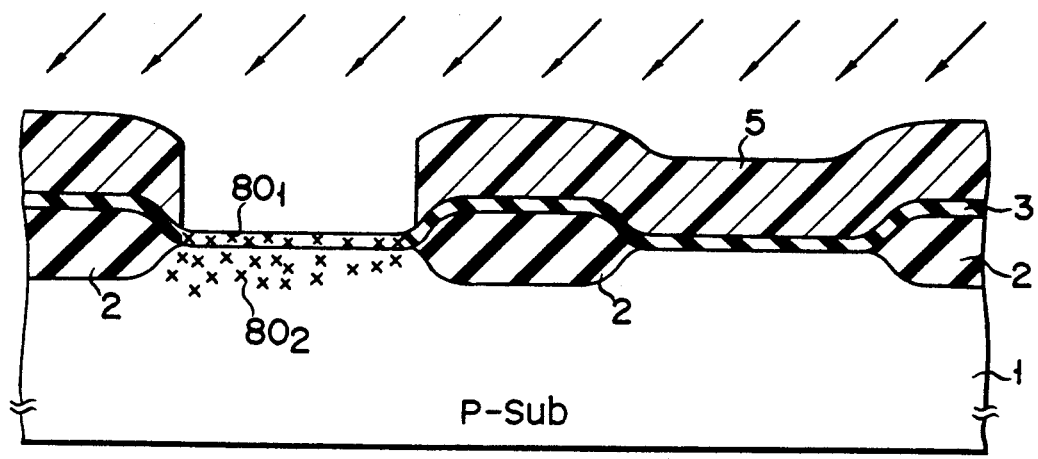
F I G. 8A
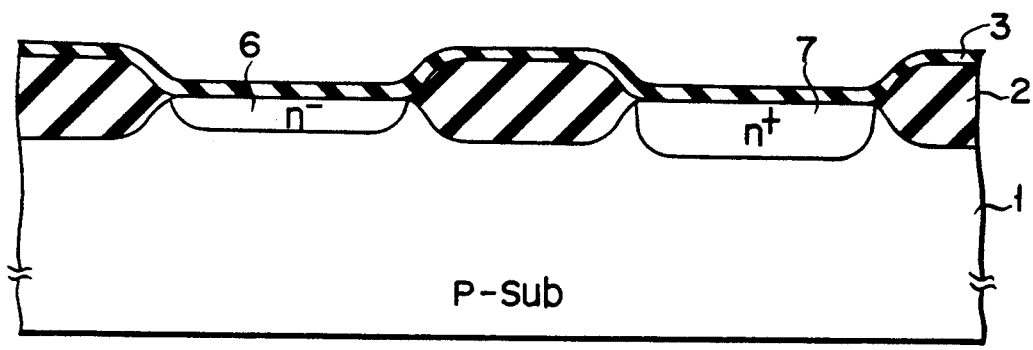
F I G. 8B

METHOD OF MANUFACTURING SEMICONDUCTOR DEVICE USING HYDROGEN AS A DIFFUSION CONTROLLING SUBSTANCE

This application is a continuation of application Ser. No. 07/636,435, filed on Dec. 31, 1990, now abandoned.

BACKGROUND OF THE INVENTION

1. Field of the Invention

The present invention relates to a method of manufacturing a semiconductor device, more particularly, to an improvement in the solid diffusion method employed for the impurity doping in the process of manufacturing a semiconductor device.

2. Description of the Related Art

Recently, the demands for an integrated circuit apparatus using a semiconductor material such as Si or GaAs as the substrate are on a sharp increase, and such an integrated circuit apparatus is becoming more and more important in the industry. The conventional method of manufacturing a semiconductor integrated circuit device comprises the steps of doping a conductive impurity into the surface region of a semiconductor substrate so as to form various impurity regions, forming an interlayer insulating film, and forming a wiring layer by vapor deposition. Particularly, the step of doping a p-type or n-type impurity (conductive impurity) in the semiconductor substrate for forming a p-type or n-type impurity region is important in the device-forming process.

A solid phase diffusion method is widely known as a method of doping a conductive impurity in the field of, for example, a Si device. In this method, a silicon oxide film having a conductive impurity added thereto, i.e., doped glass, is used as a diffusion source, and the conductive impurity is introduced by thermal diffusion from the diffusion source into the surface region of a semiconductor substrate. However, since the solid phase diffusion method is inferior to the ion implantation method in the capability of controlling the impurity dosage, the general opinion acceptable in this field was that the ion implantation would be employed in place of the solid phase diffusion method. However, in accordance with the enhancement in the density of the integrated circuit, the solid phase diffusion method has been found to be suitable for achieving a three-dimensional structure and miniaturization of the element, and has come to attract attention again in this technical field.

A trench capacitor structure is employed in, for example, a DRAM because the trench capacitor structure permits substantially increasing the capacitance without increasing the area exclusively occupied by the capacitor. For forming the trench capacitor, a groove is formed in the silicon substrate surface, and the capacitor is formed along the side walls and bottom surface of the groove. In the conventional method of forming the trench capacitor, employed is an impurity diffusion from a silicon oxide film doped with arsenic for forming an n+ type diffusion layer along the surface of the groove. This diffusion method also permits forming a diffusion layer in the side walls of the groove, though such a diffusion layer cannot be formed in the ion implantation method.

It should also be noted that the solid phase diffusion method utilizing a doped glass permits achieving a shallow impurity profile in the diffusion layer, compared with the ion implantation method. Further, it is necessary to make the source and drain regions shallow in order to shorten the channel length of a MOS transistor. The solid phase diffusion method is also hopeful for meeting this requirement.

In the conventional solid phase diffusion method outlined above, the distribution of the doped impurity is determined completely by the temperature, time and atmosphere in the thermal diffusion step as well as by the kind, concentration, etc. of the impurity contained in the doped glass diffusion source. It follows that it is impossible to control the impurity diffusion as desired unless the conditions given above are changed.

This implies that impurity regions of the same impurity profile alone can be formed by a single solid phase diffusion treatment.

On the other hand, it is required in many cases to form a plurality of impurity regions having different impurity profiles or a single impurity region having locally different impurity profiles in the manufacture of a semiconductor element which has been miniaturized in recent years. It is naturally desirable to form a single impurity region or a plurality of impurity regions having different impurity profiles in a single doping step. In the conventional solid phase diffusion method, however, it is impossible to control as desired the diffusion rate in a selective manner, making it impossible to form simultaneously a shallow diffusion layer and a deep diffusion layer in a single diffusion treatment.

It is certainly possible to form a diffusion layer having locally different impurity profiles in a single diffusion treatment in the case of using as a diffusion source a doped glass containing a plurality of impurities differing from each other in the diffusion coefficient. Even in this case, however, the diffusion coefficient of each of the impurities is determined completely by the conditions such as the temperature, treating time, and atmosphere in the step of the thermal diffusion treatment. Therefor, it is impossible that the impurity diffusion profile in a semiconductor is controlled optionally and independently. It is impossible to, for example, lower selectively the diffusion rate of one of the impurities. As a result, this technique is considered presently to be of substantially no practical value, though the technique permits forming impurity regions of different diffusion profiles in a single diffusion step, making it possible to shorten and simplify the diffusion treatment.

As described above, the conventional solid phase diffusion method is defective in that the shape and impurity diffusion profile of the impurity region to be formed is determined by the diffusion coefficient inherent in the impurity used, making it impossible to control as desired the shape and impurity diffusion profile of the impurity region. This difficulty markedly narrows the scope of application of the solid phase diffusion method in the device-forming process for a high density integrated circuit.

SUMMARY OF THE INVENTION

An object of the present invention is to provide an improved solid phase diffusion method which permits optionally controlling the diffusion rate of an impurity. To be more specific, the present invention is intended to provide a method of manufacturing a semiconductor device by using the improved solid phase diffusion method, thereby to make it possible to control as desired the shape and impurity diffusion profile of the impurity region in the semiconductor device.

Another object is to provide a method of manufacturing a semiconductor device, which permits forming impurity regions of different shapes and different impurity profiles in a single diffusion step.

According to a first embodiment of the present invention, there is provided a method of manufacturing a semiconductor device, comprising the steps of:

forming a solid phase diffusion source containing a conductive impurity on a surface of a semiconductor substrate, said impurity serving to enable said semiconductor substrate to exhibit a p-type or n-type conductivity;

allowing said solid phase diffusion source to contain a diffusion control substance serving to reduce or oxidize said conductive impurity upon heating so as to change the diffusion coefficient of the conductive impurity in the solid phase diffusion source; and thermally diffusing the conductive impurity from the solid phase diffusion source into the semiconductor substrate.

According to a second embodiment of the present invention, there is provided a method of manufacturing a semiconductor device, comprising the steps of:

forming a solid phase diffusion source containing a conductive impurity on a surface of a semiconductor substrate, said impurity serving to enable said semiconductor substrate to exhibit a p-type or n-type conductivity;

forming a diffusion control layer on said solid phase diffusion source, said diffusion control layer containing a diffusion control substance serving to reduce or oxidize said conductive impurity upon heating so as to change the diffusion coefficient of the conductive impurity in the solid phase diffusion source; and heating the solid phase diffusion source and the diffusion control layer so as to thermally diffuse the conductive impurity into the semiconductor substrate.

In the present invention, it is possible to oxidize or reduce a conductive impurity selectively at a predetermined position of the diffusion source in the thermal diffusion step. It should be noted that the conductive impurity contained in the diffusion source is enabled to exhibit a different diffusion coefficient depending on the state of oxidation or reduction thereof. Thus, it is possible to control selectively and as desired the diffusion coefficient of the impurity at a desired position within the solid phase diffusion source, making it possible to control the amount per unit time of the impurity diffused from the solid phase diffusion source into the substrate. Further, where a plurality of impurities are contained in the solid phase diffusion source, it is possible to control the kind of impurity diffused from the diffusion source into the substrate. It follows that the method of the present invention makes it possible to control as desired the impurity concentration, depth and conductivity type of the impurity region formed in the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1C are cross sectional views collectively showing a method according to the first embodiment of the present invention;

FIGS. 3A to 3D are cross sectional views collectively showing a method according to the third embodiment of the present invention;

FIGS. 8A and 8B are cross sectional views collectively showing a method according to the sixth embodiment of the present invention.

DETAILED DESCRIPTION OF THE PREFERRED EMBODIMENT

Figure 2A:
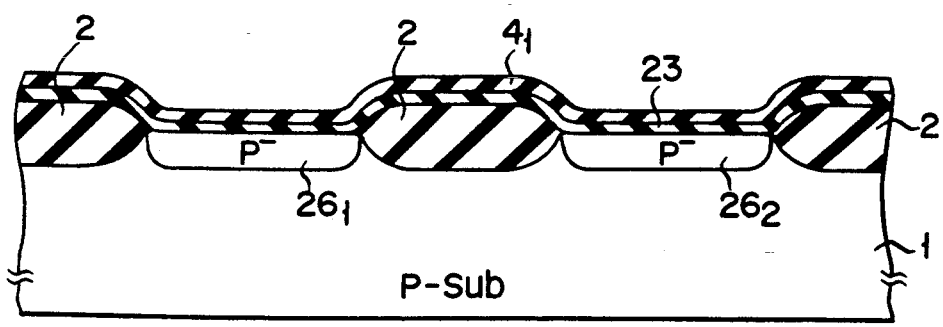
FIGS. 2A to 2C are cross sectional views collectively showing a method according to the second embodiment of the present invention.

Utilized in the present invention is a doped glass, i.e., solid phase diffusion source, containing a conductive impurity. The present invention is based on the finding that the diffusion behavior of the conductive impurity contained in the doped glass is markedly changed depending on the oxidized or reduced state of the impurity.

In general, a doped glass acting as a diffusion source is formed by a CVD method, a spin coating method (i.e., a so-called "SOG"), etc. The conductive impurity contained in the doped glass is considered to be in various chemical states depending on the method of forming the doped glass. The present invention has found that the diffusion behavior of the conductive impurity within the doped glass is greatly affected by the chemical state of the impurity within the doped glass. For example, the diffusion behavior of arsenic contained in an arsenic-doped glass has been experimentally confirmed to be as follows. Specifically, in an oxidized state in which an arsenic atom is bonded to an oxygen atom contained in a $SiO_2$ network, the arsenic has been found to be diffused very rapidly within a doped glass. In a reduced state, however, the arsenic diffusion within the doped glass is very low. Similar phenomena have been found with respect to other conductive impurities such as antimony and phosphorus in addition to arsenic, though the individual impurities differ from each other in the degree of tendency toward the oxidation and reduction.

The present inventors have a patent covering the technical idea noted above, i.e., U.S. Pat. No. 5,173,440. The technical idea relating to the chemical state and the diffusion behavior of the impurity, which is disclosed in the previous application, is incorporated in the present specification as a reference.

The present inventors have conducted an experiment as reported below in an attempt to look into the chemical state of arsenic within a doped glass. Specifically, a doped glass containing arsenic was subjected to a heat treatment for four hours under a nitrogen gas atmosphere of 1000° C., followed by applying an X-ray excited electron spectral analysis (XPS) to the heat-treated doped glass. Also, the same doped glass was subjected to a heat treatment for an hour under a nitrogen gas atmosphere of 1000° C. containing 10% of hydrogen, followed by applying an XPS to the heat-treated doped glass. It has been found that strong peaks corresponding to $A_2O_3$ and $As_2O_5$ appear in a bonding energy region of about 45 eV in the case of a doped glass subjected to the heat treatment under a nitrogen gas atmosphere. In the doped glass thermally reduced under an atmosphere containing hydrogen, however, the peak in a bonding energy region of about 45 eV was weakened. Also, a strong peak corresponding to arsenic appeared in the bonding energy region of about 41 eV. It follows that the oxidized state of an impurity in the present invention is defined to denote the state of a high bonding energy in XPS. Likewise, the reduced state of an impurity is defined to denote the state of a low bonding energy in XPS.

In the present invention, hydrogen constitutes a typical example of a diffusion control substance serving to reduce the impurity contained in the doped glass. Hydrogen may be supplied in the form of a hydrogen molecule, $H^+$ ion or hydrogenated ion such as $SiH_3^+$. The ionized hydrogen is bonded to an oxygen atom in the $SiO_2$ network in place of an impurity atom such as an arsenic atom. As a result, the impurity such as arsenic is released from the $SiO_2$ network so as to be put in a reduced state. Naturally, substances other than hydrogen may be used in the present invention as a diffusion control substance serving to reduce the impurity, as far as the substance can be bonded to the oxygen atom within the $SiO_2$ network in place of the impurity atom such as an arsenic atom. To be more specific, a halogen element such as fluorine and chlorine may also be used in the present invention as the diffusion control substance.

On the other hand, oxygen constitutes a typical example of a diffusion control substance serving to oxidize the impurity contained in the doped glass. Oxygen may be supplied in the form of an oxygen molecule, oxygen ion or an oxide ion such as $SiO^+$.

To reiterate, the chemical state of the impurity contained in the doped glass is changed in the present invention based on the technical idea described above so as to control the diffusion of the impurity. The particular method of the present invention makes it possible to form easily impurity regions of a complex structure such as an LDD structure.

FIG. 1 shows a method of forming an impurity region according to a first embodiment of the present invention. In the first step, a field oxide film 2 is selectively formed on the surface of a p-type (100) silicon substrate 1 by a known method such as LOCOS method, as shown in FIG. 1A. The silicon substrate 1 has a resistivity of, for example, 10 Ω.cm. Desired impurity regions are formed in element regions separated from each other by the field oxide film 2 as follows.

In the first step, a doped glass film (silicon oxide film) 3 doped with $6 \times 10^{20}$ $cm^{-3}$ of arsenic and having a thickness of 50 nm is deposited by means of LPCD (low pressure chemical vapor deposition) using TEOS (tetraethoxy silane) and TEOA (triethoxy arsine) as raw material gases. Then, a silicon nitride film $4_1$ is deposited on the entire surface by the LPCVD method using $SiH_2Cl_2$ (dichloro silane) and $NH_3$ (ammonia) as raw material gases so as to obtain the structure shown in FIG. 1(a). Instead of $SiH_2Cl_2$, other gases having a Si-H and/or Si-halogen bond, for example, $SiH_4$, $Si_2H_6$, $SiHCl_3$, $SiCl_4$, $SiF_4$, $SiHCl_3$, $SiH_2F_2$ may be used. In the step of depositing the silicon nitride film $4_1$, the hydrogen is generated by the decomposition of the raw material gases, with the result that the silicon nitride film thus deposited contains hydrogen.

In the next step, a resist film 5 is formed on the entire surface, followed by patterning the resist film by the known method such that the remaining resist film 5 covers a part of an element region, as shown in FIG. 1B. Then, the exposed portion of the silicon nitride film $4_1$ is removed by means of reactive ion etching (RIE) using the resist film 5 as an etching mask. As a result, formed is a silicon nitride film pattern $4_2$ covering a predetermined element region.

Further, the resist film 5 is removed so as to expose the silicon nitride film pattern $4_2$ as shown in FIG. 1C, followed by applying a heat treatment for one hour at such a high temperature as 1000° C. under a nitrogen gas atmosphere. As a result, the arsenic contained in the doped glass film 3 is diffused into the silicon substrate 1. It should be noted that the arsenic is diffused deep into the substrate with a high concentration in the region which is not covered with the silicon nitride film pattern $4_2$ so as to form an $n^+$-type region 7. On the other hand, the arsenic diffusion into the substrate is shallow and the diffused arsenic concentration is low in the region covered with the silicon nitride film pattern $4_2$ so as to form an $n^-$-type region.

The reason for the simultaneous formation of the shallow diffusion layer 6 and the deep diffusion layer 7 is as follows. Specifically, the hydrogen contained in the silicon nitride film pattern $4_2$ is supplied to the doped glass film 3 positioned below the silicon nitride film pattern $4_2$. What should be noted is that the arsenic contained in the doped glass film 3 is reduced by the hydrogen supplied from the silicon nitride film pattern $4_2$, with the result that the diffusion rate of the arsenic is markedly suppressed within the doped glass 3. Naturally, the arsenic diffusion into the silicon substrate 1 is delayed. In addition, the amount of the arsenic diffusion into the silicon substrate 1 is lowered. It follows that formed is the shallow $n^-$-type region 6 of a low arsenic concentration. When it comes to the region which is not covered with the silicon nitride film pattern $4_2$, however, hydrogen is not supplied to the doped glass film 3, with the result that the arsenic, which is likely to be reduced, is not reduced but is diffused under an oxidized state into the substrate. Naturally, a large amount of arsenic is diffused promptly into the silicon substrate 1 so as to form the deep $n^+$-type region 7 having a high arsenic concentration. It follows that the method of the present invention makes it possible to form impurity regions of different impurity distribution in a single thermal diffusion treatment.

FIG. 2 shows a second embodiment of the present invention. The second embodiment shown in FIG. 2 differs from the embodiment of FIG. 1 in that an impurity region of a double diffusion structure consisting of a p-type layer and an n-type layer is formed in the embodiment of FIG. 2.

The structure shown in FIG. 1A is prepared first in the second embodiment, too. In the second embodiment, however, a doped glass film (silicon oxide film) 23 doped with both arsenic and boron is used as the diffusion source as shown in FIG. 2A in place of the doped glass 3 used in the first embodiment. The use of the doped glass film 23 is an important feature of the embodiment shown in FIG. 2. After formation of the doped glass film 23, a heat treatment is applied for one hour at such a high temperature as 1000° C. under a nitrogen gas atmosphere so as to permit the hydrogen contained in the silicon nitride film $4_1$ to be supplied to the doped glass film 23. As described previously, the arsenic contained in the doped glass film is reduced by the hydrogen, with the result that the diffusion coefficient of the arsenic is lowered. However, the boron contained in the doped glass film 23 is not reduced by the hydrogen. It follows that the boron alone is selectively diffused into the silicon substrate, while suppressing the arsenic diffusion, so as to form $p^-$-type regions $26_1$ and $26_2$ in the substrate as shown in FIG. 2A.

Figure 2B:
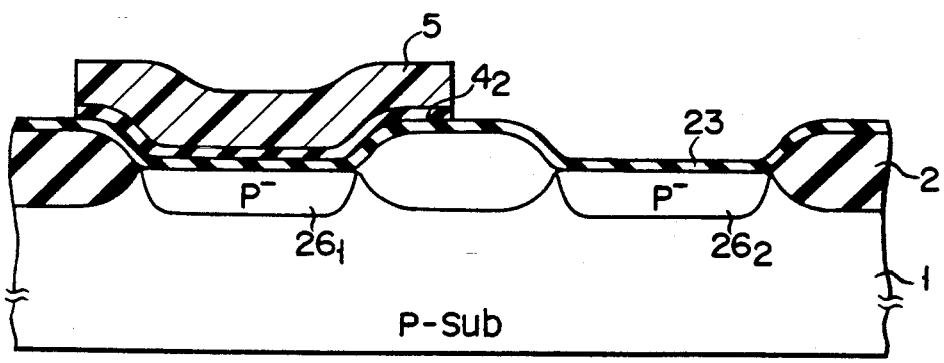
Figure 2C:
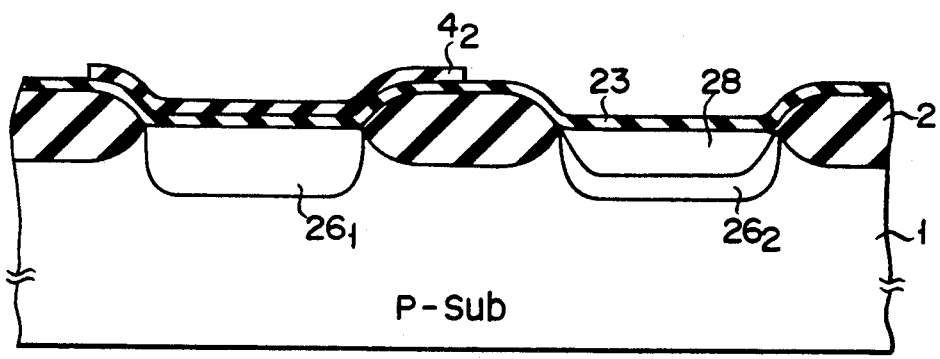

In the next step, the silicon nitride film $4_1$ is patterned as in the first embodiment so as to form the silicon nitride film pattern $4_2$ covering a predetermined element region, as shown in FIG. 2B. Then, the resist film 5 used as an etching mask in the preceding patterning step of the silicon nitride film is removed, followed by applying a heat treatment for one hour at such a high temperature as 1000° C. under a nitrogen gas atmosphere. The heat treatment permits both arsenic and boron to be diffused into that region of the silicon substrate which is not covered with the silicon nitride film pattern $4_2$ because hydrogen is not supplied to the doped glass film 23. As a result, formed are an $n^+$-type diffusion layer 28 and a $p^-$-type diffusion layer $26_2$ as shown in FIG. 2C. When it comes to the region covered with the silicon nitride film pattern $4_2$, however, the hydrogen contained in the pattern is supplied to the doped glass film 23. It follows that the arsenic diffusion is suppressed as in the previous thermal diffusion step so as to permit boron alone to be diffused into the substrate. It follows that a $p^-$-type diffusion layer $26_1$ alone is formed in the substrate.

As described above, the second embodiment shown in FIG. 2 utilizes the doped glass film 23 doped with a plurality of impurities, and the impurity diffusion is selectively suppressed with respect to the impurity which tends to be reduced easily. This implies that the diffusion of a plurality of impurities can be independently controlled in the present invention. It follows that it is possible to provide a greater variation in terms of the distribution of the impurity concentration and, thus, the scope of application of the solid phase diffusion method can be markedly widened. In $SiO_2$, oxides of Al, B, In, Ga, P, Sb, and As trend to be reduced in this order. Thus, when a pn-Junction is formed, it is desirable to used p- and n- impurities of given two of these substances, which are not close to each other in this order. The same is applicable to the case when an $n^+/n$ junction is formed.

FIG. 3 shows a method of manufacturing a MOS transistor having an LDD (lightly doped drain) structure according to a third embodiment of the present invention. As shown in FIG. 3A, a field oxide film 2 is selectively formed on the surface of a p-type (100) silicon substrate 1 by the known method such as LOCOS method. The silicon substrate 1 has a resistivity of, for example, 10 Ω.cm. Then, a gate oxide film 8 and a gate electrode 9 are formed in an element region, followed by forming desired impurity regions by the method of the present invention, as follows.

In the first step, a doped glass film (silicon oxide film) 33 doped with $6 \times 10^{20}$ cm$^{-3}$ of arsenic and having a thickness of 50 nm is deposited by means of LPCD (low pressure chemical vapor deposition) using TEOS (tetraethoxy silane) and TEOA (triethoxy arsine) as raw material gases, as shown in FIG. 3B. Then, a silicon nitride film (not shown) is deposited on the entire surface by the LPCVD method using $SiH_2Cl_2$ (dichloro silane) and $NH_3$ (ammonia) as raw material gases. Then, RIE is applied to the silicon nitride film so as to achieve etching in a thickness corresponding to the thickness of the silicon nitride film. As a result, the silicon nitride film is left unremoved on only the side wall portion of the gate electrode 9 so as to form a side-wall silicon nitride film pattern 34. Since the other portion of the silicon nitride film is completely removed, the doped glass film 33 is exposed to the outside.

In the next step, a thermal diffusion is carried out under the state shown in FIG. 3B using a heating apparatus including a lamp. The thermal diffusion is carried out by means of a rapid thermal annealing (RTA) for two seconds at 1200° C. under a nitrogen gas atmosphere. In this heat treatment, the hydrogen contained in the side-wall silicon nitride film pattern 34 is diffused into the doped glass film 33 so as to reduce the arsenic contained in the doped glass film 33, with the result that the diffusion coefficient of the arsenic is diminished within the doped glass. It follows that $n^-$-type arsenic diffusion regions $36_1$ and $36_2$ having a low arsenic concentration and a low junction depth are formed in the substrate below the side-wall silicon nitride film pattern 34 in the vicinity of the channel region. On the other hand, the arsenic contained in the doped glass film 33 positioned away from the side-wall silicon nitride film pattern 34 is not reduced and, thus, the diffusion rate of the arsenic is not suppressed. In addition, the heat treatment is carried out at such a high temperature which permits a high solid solubility of arsenic in silicon. It follows that $n^+$-type arsenic diffusion regions $37_1$ and $37_2$ having a high surface arsenic concentration and a deep junction are formed in the silicon substrate away from the side-wall silicon nitride film pattern 34. In conclusion, it is possible to form an LDD structure in a single heat treatment, i.e., an LDD structure comprising the $n^-$-type regions $36_1$, $36_2$ in the vicinity of the channel region and the $n^+$-type regions $37_1$, $37_2$ positioned outside the $n^-$-type regions $36_1$, $36_2$, as shown in FIG. 3C.

In the subsequent step, a MOS structure as shown in FIG. 3D is formed by the known method. Specifically, an interlayer insulating film 11 is deposited first, followed by forming contact holes for the wiring in the interlayer insulating film. Further, barrier metal layers $12_1$, $12_2$ and lead wires $10_1$, $10_2$ are formed so as to obtain a desired MOS transistor.

Figure 4:
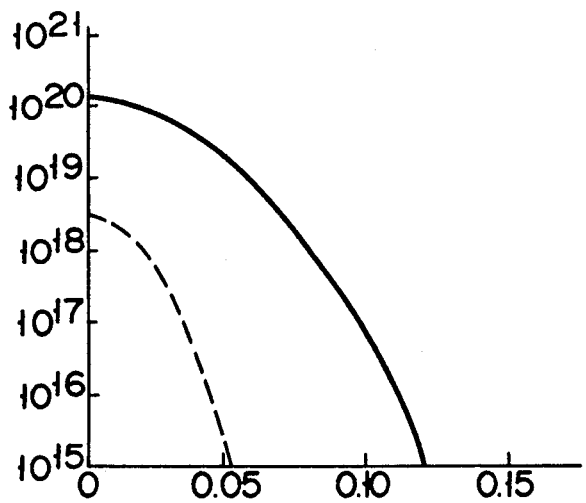
FIGS. 4 is a graph showing the impurity concentration profile of the impurity region formed in the third embodiment of the present invention.

FIG. 4 shows the arsenic concentration profile in the MOS transistor formed by the third embodiment described above, a broken line in FIG. 4 denoting the $n^-$-type regions $36_1$, $36_2$ and a solid line representing the $n^+$-type regions $37_1$, $37_2$. As apparent from FIG. 4, the arsenic concentration in the $n^+$-type regions $37_1$, $37_2$ is about 100 times as high as that in the $n^-$-type regions $36_1$, $36_2$ on the average. On the other hand, the depth of the pn junction in the $n^-$-type regions $36_1$, $36_2$ is about half the depth in the $n^+$-type regions $37_1$, $37_2$.

It follows that a very desirable LDD structure is formed in the embodiment of FIG. 3.

In the manufacture of a highly integrated device, it is unavoidable for the number of treating steps to be increased in order to form very small elements of a complex shape. Thus, the method of the present invention which permits forming an LDD structure in a single heat treatment is highly useful as a means for simplifying the manufacturing process of a highly integrated device.

FIG. 5 shows a fourth embodiment of the present invention. In the third embodiment described previously, the doped glass film 33 is left unremoved even after the diffusion step. In the fourth embodiment, however, the doped glass film 33 is removed, as desired.

Figure 5A:
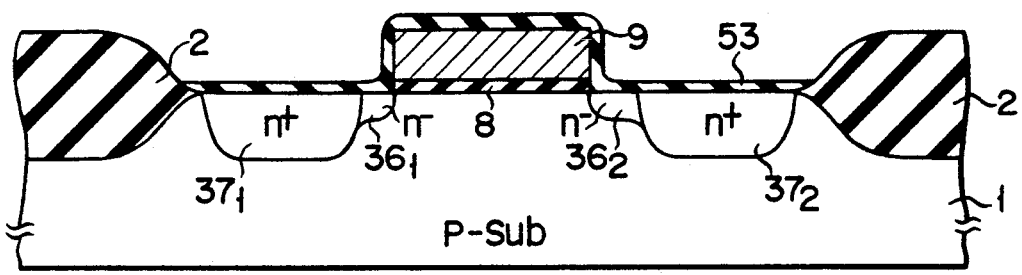
FIGS. 5A and 5B are cross sectional views collectively showing a method according to the fourth embodiment of the present invention.
Figure 5B:
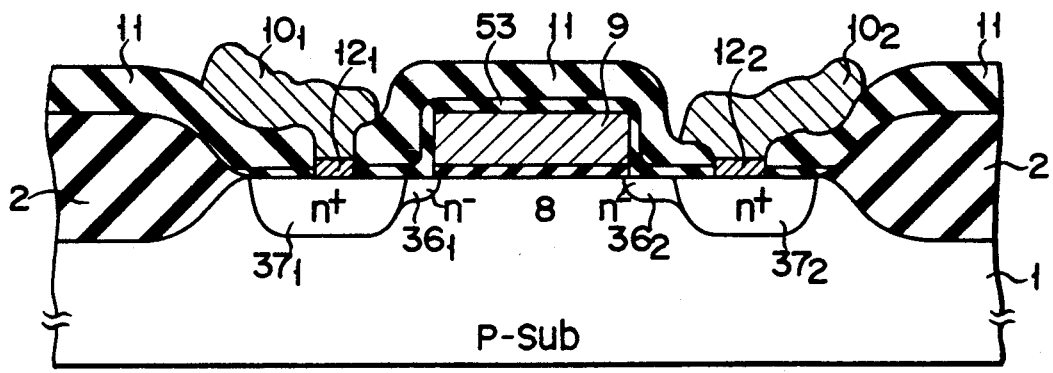

In the fourth embodiment, an LDD structure as shown in FIG. 3C is formed as in the third embodiment. Then, the side-wall silicon nitride film pattern 34 is removed by an isotropic plasma etching according to a down flow method, followed by further etching away the doped glass film 33. Further, a heat treatment at a high temperature is performed under an oxidizing atmosphere so as to form an oxide film 53 about 10 nm thick in a manner to cover the gate electrode 9 and the surfaces of the source and drain regions, as shown in FIG. 5A. After formation of the oxide film 53, a desired MOS transistor is formed by the known method. Specifically, an interlayer insulating film 11 is deposited, followed by forming contact holes for the wiring in the film 11, as shown in FIG. 5B. Further, barrier metal layers $12_1$, $12_2$ and lead wires $10_1$, $10_2$ are formed so as to obtain a desired MOS transistor.

The fourth embodiment permits producing the effects exactly equal to those produced by the third embodiment. In addition, the diffusion source 33 is removed after formation of the LDD structure in the fourth embodiment shown in FIG. 5, with the result that it is possible to prevent the further diffusion of arsenic in the subsequent heat treatment step. It follows that it is possible to control the arsenic concentration stably.

FIG. 6 shows a fifth embodiment of the present invention. In this embodiment, the solid phase diffusion method of the present invention is employed for forming a trench MOS capacitor. In the first step, a field oxide film 2 is selectively formed by a known method on a p-type (100) silicon substrate 1 having a resistivity of, for example, 10 $\Omega$.cm so as to separate element regions, as shown in FIG. 6A. Then, a silicon oxide film is deposited by CVD, followed by patterning the silicon oxide film by photoetching process (PEP) so as to form a silicon oxide pattern 65 provided with openings at regions corresponding to the regions for forming trench capacitors. After formation of the silicon oxide pattern 65, a groove 60 for a trench capacitor is formed by RIE using a $CCl_4$-based etching gas. In this step, the oxide pattern 65 is used as an etching mask.

Figure 6A:
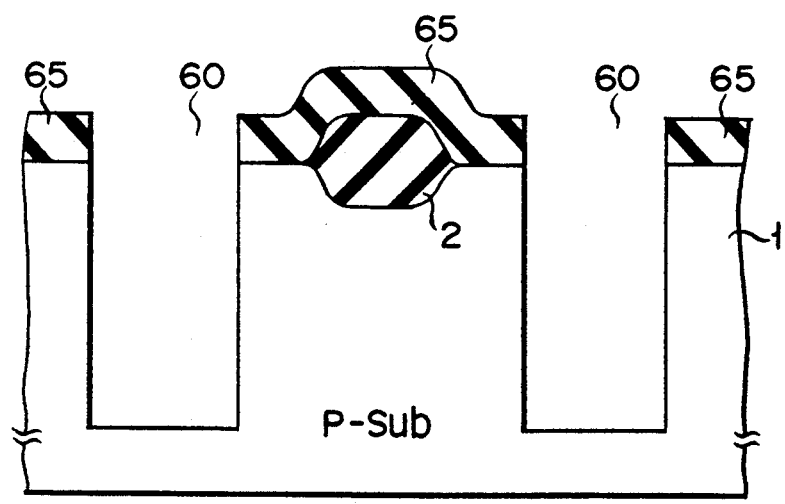
FIGS. 6A to 6D are cross sectional views collectively showing a method according to the fifth embodiment of the present invention.
Figure 6B:
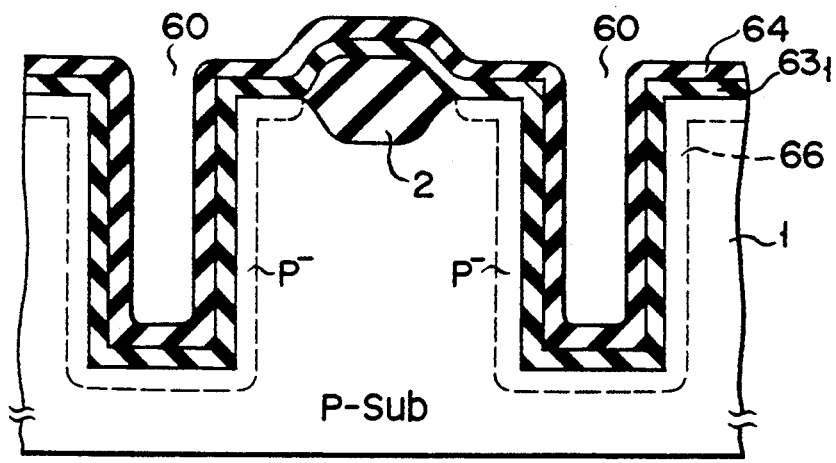

In the next step, the oxide film pattern 65 is etched away with a diluted hydrofluoric acid, followed by applying a solid phase diffusion method of the present invention. To be more specific, a doped glass film (silicon oxide film) $63_1$ having a thickness of 100 nm is deposited by, for example, LPCVD method, as shown in FIG. 6B. The doped glass film $63_1$ contains $2 \times 10^{20}$ $cm^{-3}$ of boron and $6 \times 10^{20}$ $cm^{-3}$ of arsenic. Then, a silicon nitride film 64 is deposited on the entire surface by LPCVD method using dichloro silane and ammonia as raw material gases, followed by applying a heat treatment at 1000° C. for 60 minutes. The heat treatment permits the hydrogen contained in the silicon nitride film 64 to be diffused into the doped glass film $63_1$ so as to reduce the arsenic contained in the doped glass film $63_1$. It follows that the diffusion coefficient of the arsenic within the doped glass film is diminished so as to suppress the arsenic diffusion into the silicon substrate 1. As a result, boron alone is selectively diffused from the doped glass film $63_1$ into the silicon substrate 1. It follows that a $p^-$-type region 66 is formed in the surface region of the silicon substrate 1, as shown in FIG. 6B.

Figure 6C:
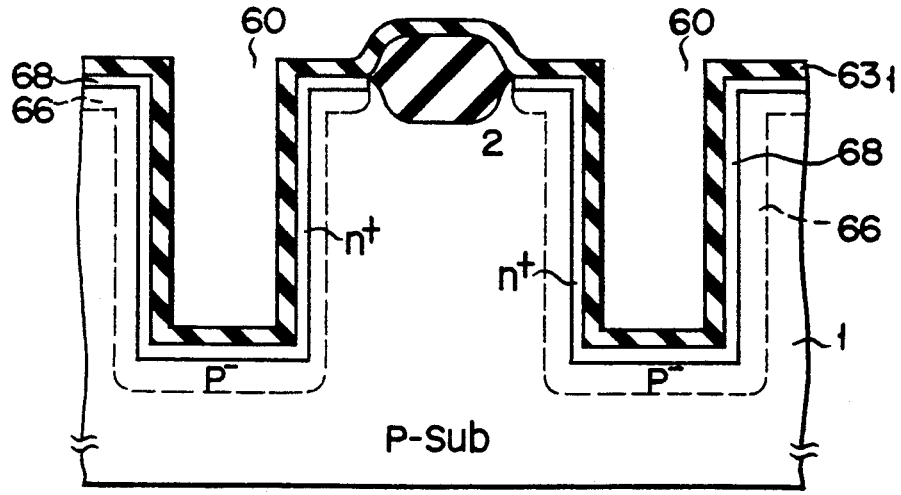

In the next step, the silicon nitride film 64 is removed by an isotropic plasma etching (down flow method), followed by applying a heat treatment at 900° C. under a nitrogen gas atmosphere containing 10% of oxygen gas. The arsenic contained in the doped glass film $63_1$ is oxidized again by the heat treatment noted above and, thus, is made ready for diffusion. Then, an additional heat treatment is applied at 1000° C. for 30 minutes under a nitrogen gas atmosphere which does not contain an oxygen gas. In this heat treatment, the arsenic diffusion is not suppressed, with the result that both arsenic and boron are simultaneously diffused from the doped glass film $63_1$ into the silicon substrate 1. As a result, formed is a double diffusion layer consisting of the $n^+$-type region 68 and the $p^-$-type region 66, as shown in FIG. 6C.

As described above, oxygen is added to the nitrogen atmosphere gas in the step of heat treatment in the fifth embodiment shown in FIG. 6 so as to supply oxygen to the doped glass film $63_1$. As a result, the impurity under a reduced state and having a low diffusion coefficient is oxidized again to easily an diffusable state. It follows that the oxidized impurity can be diffused into the silicon substrate.

Figure 6D:
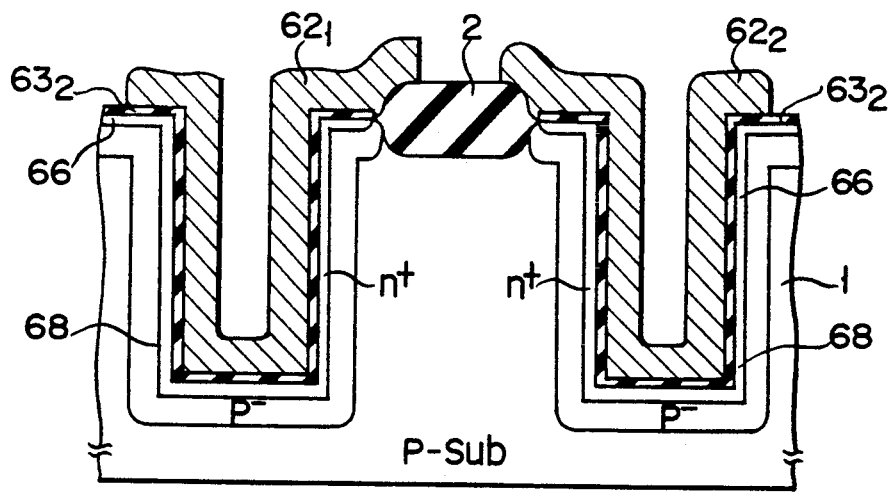

After formation of the double diffusion layer, the doped glass film $63_1$ is etched away with a diluted hydrofluoric acid, followed by applying thermal oxidation at 900° C. under a 50% dry oxygen gas atmosphere diluted with argon gas so as to form an oxide film $63_2$ having a thickness of 10 nm, said oxide film being included in a MOS capacitor, as shown in FIG. 6D. Further, a capacitor electrode 62 consisting of a phosphous doped polycrystalline silicon is formed by the known method so as to form a desired trench MOS capacitor.

Figure 7A:
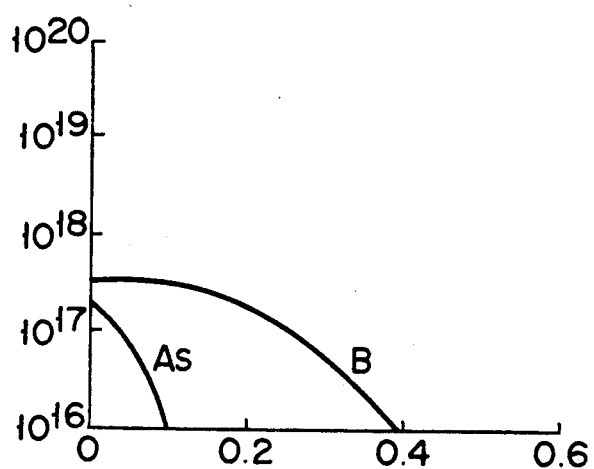
FIGS. 7A and 7B are graphs each showing the impurity concentration profile of the impurity region formed in the fifth embodiment of the present invention.
Figure 7B:
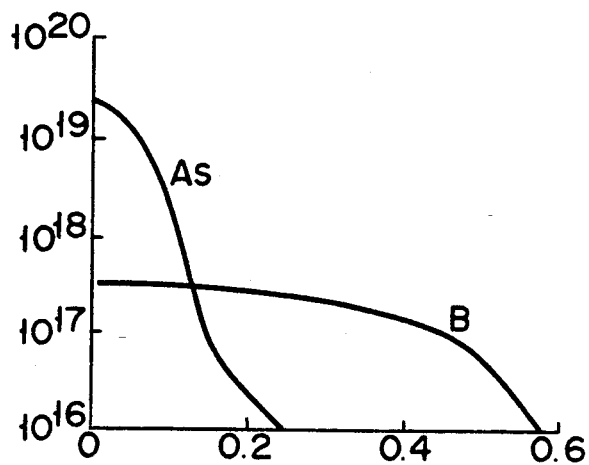

FIGS. 7A and 7B show the dopant profiles starting with the surface of the silicon substrate 1 with respect to the trench capacitors formed in the fifth embodiment described above. FIG. 7A covers the state shown in FIG. 6B, with FIG. 7B covering the state shown in FIG. 6C.

As apparent from FIG. 7A, arsenic is diffused only slightly into the silicon substrate 1 in the step of forming the $p^-$-type region 66 shown in FIG. 6B because hydrogen is supplied from the silicon nitride film 64 into the doped glass film 63 so as to reduce the arsenic contained in the doped glass film. On the other hand, the boron contained in the doped glass film $63_1$ is not reduced and, thus, is diffused deep into the silicon substrate 1. Further, FIG. 7B clearly shows that both arsenic and boron are sufficiently diffused into the silicon substrate 1 in the step of forming the $p^-$-type region 66 and the $n^+$-type diffusion region 68. It should be noted in this connection that the arsenic contained in the doped glass film $63_1$ is oxidized again by the heat treatment under an oxygen-containing atmosphere. Thus, both arsenic and boron are sufficiently diffused into the silicon substrate in the subsequent heat treatment performed under a nitrogen gas atmosphere, leading to the formation of a double diffusion layer consisting of the n+-type region 68 and the p--type region 66.

As apparent from the fifth embodiment described above, it is possible to employ a solid phase diffusion method of the present invention using a plurality of conductive impurities, so as to independently control the diffusion of these impurities with a simple process. As a result, it is possible to control the formation of impurity regions of a complex shape, so as to make it possible to simplify the process for manufacturing a semiconductor device of a fine device structure or to decrease the number of steps required for the manufacturing process of the semiconductor device.

Finally, FIG. 8 shows a sixth embodiment of the present invention. The sixth embodiment differs from the first embodiment shown in FIG. 1 in the method of introducing hydrogen.

The sixth embodiment is exactly the same as the first embodiment in the process up to the formation of the doped glass film 3, except that the thickness of the doped glass film 3 is set at 300 nm in the sixth embodiment. Then, a resist mask 5 is formed, followed by implanting hydrogen ions into the doped glass film 3 and the silicon substrate 1 at a dose of $5 \times 10^{15}$ cm$^{-2}$ and under an accelerating energy of 20 kev, as shown in FIG. 8A. After the hydrogen ion implantation, the resist mask 5 is removed, followed by a heat treatment at 900° C. for 60 minutes. As a result, a shallow n--type region 6 is formed in the hydrogen-implanted region, with a deep n+-type region 7 being formed in a region into which the hydrogen ions were not implanted, as shown in FIG. 8B.

It is possible to obtain the effect exactly equal to that obtained in the first embodiment in the case where hydrogen $80_1$ is directly introduced into the solid phase diffusion source as in the sixth embodiment. In this case, the hydrogen $80_2$ which has been implanted into an inner region of the substrate comes out into the atmosphere through the doped glass film 3 at the heat treatment step. What should be noted is that some of the hydrogen atoms passing through the doped glass film serve to reduce the impurity contained in the doped glass film.

The hydrogen ion implantation was employed in the sixth embodiment described above. However, it is also possible to use other ions capable of reducing or oxidizing the impurity such as oxygen, hydride ions like $SiH_3^+$ and oxide ions like $SiO^+$.

The present invention is not restricted to the embodiments described above. Specifically, the method of the present invention can be modified as summaried below:

1. The base material into which an impurity is introduced is not restricted to a silicon substrate. It is possible to use a polycrystalline or amorphous silicon layer in place of the silicon substrate. Also, a semiconductor material other than silicon can be used in the present invention such as germanium semiconductor or compound semiconductor such as GaAs or InP.

2. The conductive impurities used in the present invention are not restricted to boron and arsenic. Further, it is possible to employ a solid phase diffusion from a doped glass film containing three or more kinds of impurities.

3. The thin film containing hydrogen serving to reduce an impurity need not be restricted to a silicon nitride film. For example, it is also possible to use a polycrystalline silicon film or an amorphous silicon film formed by CVD using silane as a raw material gas. In short, it suffice for the thin film to contain hydrogen and for the hydrogen to be diffused into a doped glass film by a heat treatment.

What is claimed is:

1. A method of manufacturing a semiconductor device, comprising the steps of:
    forming, on a surface of a semiconductor substrate, a solid phase diffusion source layer including a first region containing a conductive impurity of n-type and a second region containing a conductive impurity of n-type and hydrogen as a diffusion control substance which serves to decrease the diffusion coefficient of said conductive impurity in said second region of the solid phase diffusion source layer; and
    thermally diffusing, in an inert atmosphere, the conductive impurity from said solid phase diffusion source layer into said semiconductor substrate, thereby forming a shallower impurity region under said second region of the solid phase diffusion source layer and a deeper impurity region under said first region of the solid phase diffusion source layer.

2. A method of manufacturing a semiconductor device according to claim 1, wherein said hydrogen is introduced into said solid phase diffusion source layer by means of an ion implantation.

3. A method of manufacturing a semiconductor device according to claim 1, wherein said n-type impurity is arsenic.

4. A method of manufacturing a semiconductor device according to claim 1, wherein said solid phase diffusion source layer is formed so as to also contain, in addition to said n-type impurity, a p-type impurity which is harder to be reduced with hydrogen than said n-type impurity, thereby during said diffusion step forming a double diffusion region consisting of a p-type impurity region and a n-type impurity region in said p-type impurity region.

5. A method of manufacturing a semiconductor device according to claim 4, wherein said n-type impurity is arsenic and said p-type impurity is boron.

6. A method of manufacturing a semiconductor device, comprising the steps of:
    forming a solid phase diffusion source layer containing a conductive impurity of n-type on a surface of a semiconductor substrate;
    selectively forming, on the surface of said solid phase diffusion source layer, a CVD-silicon nitride layer pattern containing hydrogen as a diffusion control substance which serves to cause reduction of the conductive impurity upon heating so as to change the diffusion coefficient of said conductive impurity in the solid phase diffusion source layer; and
    thermally diffusing, in an inert atmosphere, the conductive impurity from said solid phase diffusion source layer into said semiconductor substrate, thereby forming a shallower impurity region and a deeper impurity region at the same time.

7. A method of manufacturing a semiconductor device according to claim 6, wherein said n-type impurity is arsenic.

8. A method of manufacturing a semiconductor device according to claim 6, wherein said solid phase diffusion source layer is formed so as to also contain, in addition to said n-type impurity, a p-type impurity which is harder to be reduced with hydrogen than said n-type impurity, thereby during said diffusion step forming a double diffusion region consisting of a p-type impurity region and a n-type impurity region in said p-type impurity region.

9. A method of manufacturing a semiconductor device according to claim 8, wherein said n-type impurity is arsenic and said p-type impurity is boron.

10. A method of manufacturing a semiconductor device according to claim 6, wherein said CVD-silicon nitride layer pattern is removed after said step of thermally diffusing is performed, and then followed by a further step of thermally diffusing under an oxygen-containing atmosphere.

* * * * *